United States Patent [19]

Petersen et al.

[11] Patent Number: 4,986,760
[45] Date of Patent: Jan. 22, 1991

[54] SOCKET FOR TAB BURN-IN AND TEST

[75] Inventors: Kurt H. Petersen; Juan P. Rios, both of Austin, Tex.

[73] Assignee: Minnesota Mining and Manufacturing Company, St. Paul, Minn.

[21] Appl. No.: 354,903

[22] Filed: May 19, 1989

[51] Int. Cl.⁵ .............................................. H01R 9/09
[52] U.S. Cl. .................................... 439/71; 439/72; 439/73; 439/81
[58] Field of Search ................... 439/70-73, 439/81, 82, 68, 656

[56] References Cited

U.S. PATENT DOCUMENTS

| 4,176,895 | 12/1979 | Aldridge | 439/71 |
| 4,341,433 | 7/1982 | Cherian et al. | 439/71 |
| 4,376,560 | 3/1983 | Olsson et al. | 339/17 |
| 4,378,139 | 3/1984 | Griffin et al. | 339/75 |
| 4,553,805 | 11/1985 | Aikens | 339/75 |
| 4,630,875 | 12/1986 | Korsunsky et al. | 439/73 |
| 4,758,176 | 7/1988 | Abe et al. | 439/72 |
| 4,846,703 | 7/1989 | Matsuoka et al. | 439/81 |
| 4,872,850 | 10/1989 | Magi et al. | 439/70 |

Primary Examiner—Paula A. Bradley
Attorney, Agent, or Firm—Donal M. Sell; Walter N. Kirn; John C. Barfnes

[57] ABSTRACT

Test and burn-in sockets with many mechanical contacts require increased support strength, and with the increase in the number of contacts it is beneficial that the contacts are inserted before assembly, the contacts in the support comb are supported to restrict movement of the contact other than in the path of movement of the IC device, and the registration and movement of the IC device is sufficient to obtain good electrical contact and maintain electrical contact during temperature cycling.

16 Claims, 7 Drawing Sheets

SOCKET FOR TAB BURN-IN AND TEST

BACKGROUND OF THE INVENTION

1. Field of the Invention

This invention relates to a socket having improved structural strength for burn-in and test of high lead count tape automated bonded very large scale integrated circuits (TAB IC devices) with closely spaced pads and in one aspect relates to an improved contact and contact mounting comb for improving and maintaining the alignment between each contact and associated tape pad.

2. Background of the Invention

The high lead count of TAB IC devices or leadless chip carriers formed of ceramic present unique problems in socket design since each contact must press against the TAB-test pad with a force high enough to insure reliable electrical contact. The force of all the contacts is additive and must be resisted by the strength of the socket. The socket must contain sufficient contacts to connect the TAB IC device to an external piece of electronic equipment. The socket must provide means to register the TAB IC device and carrier for accurate location, to control contact placement and deflection for contacting the test points, to accept thermal expansion variations without losing that contact, and to provide force at high enough levels to insure a reliable electrical connection through thermal cycling.

The prior art devices for test or burn-in of integrated circuit devices have many of the critical features of alignment, pressure contact with the pads, and a quad pack design. Examples of the socket configurations are illustrated in U.S.A. Pat. Nos. 4,378,139 and 4,553,805. These sockets for the IC devices are formed with contacts affording a wiping action on the test pads of the carrier and the registration is changed between the pad and the end of the contact when the carrier is pressed against the contact as the contact pivots during vertical movement of the carrier to press it against the contacts Further, the socket is not provided with any means of maintaining the contact during the temperature cycling which results in differential expansion of the TAB device, socket and contacts except the size of the contact and the pads.

The present invention is an improvement over existing sockets in that the contacts are formed to permit vertical movement of the pad contacting end, the contacts are mounted to restrict movement to a vertical direction and maintain sufficient strength to maintain good electrical contact, the combs supporting the contacts afford increased density between the contacts and pads, the combs are individually supported on the sides of the socket, the socket has a rigid support for the comb and expansion of the comb and movement of the contacts is limited to movement from the center of the comb to an end, the carrier is moved vertically and no horizontal component is introduced into the movement which causes a buckling of the TAB carrier either due to the movement of the contact or the swinging movement of the clamping or latching device, and the force applying mechanism is simplified and very easily operated to apply sufficient force against the carrier to make reliable contact with the multiple contacts.

SUMMARY OF THE INVENTION

The present invention affords an improved socket for test and burn-in of an integrated circuit device with a plurality of closely spaced pads. The socket comprises a support for a plurality of contacts which support has means for retaining said contacts in spaced relationship. Each contact has a contact end for making pressure contact with a TAB pad in a carrier, an intermediate body portion affording movement of said contact end, and a connecting end for making connection with a piece of electronic equipment. The contact end has a straight portion connected to a first flex area affording straight line movement of said contact end in relationship to an intermediate body portion and the first flex area is joined to a curved arcuate second flex area affording movement of first flex area and the contact end in relationship to said support. The intermediate portion has a contact anchoring portion to hold the contact to a support and join the contact end to the connecting end.

The support is in the form of a comb which supports a plurality of the contacts in close spaced relationship, affording rows of contact ends and spaced connecting ends. The combs are formed to mount on beams of the socket for improved support and to reduce the deleterious effects of differential thermal expansion between the parts.

The socket comprises a frame having beams defining the position of the contacts and providing support for the combs and means defining alignment means to accurately position a carrier in relationship to the beams, a plurality of contact support combs, each support comb being disposed one on each beam with the support combs each supporting a plurality of contacts, the support combs having means for retaining the contacts in spaced relationship, and a lid or cover to be positioned over the frame and a carrier including force transfer means for urging the pads of the TAB device against the contacting ends of the contacts.

BRIEF DESCRIPTION OF THE DRAWING

The present invention will be further described with reference to the accompanying drawing wherein.

DETAILED DESCRIPTION OF THE INVENTION

Figure 1:
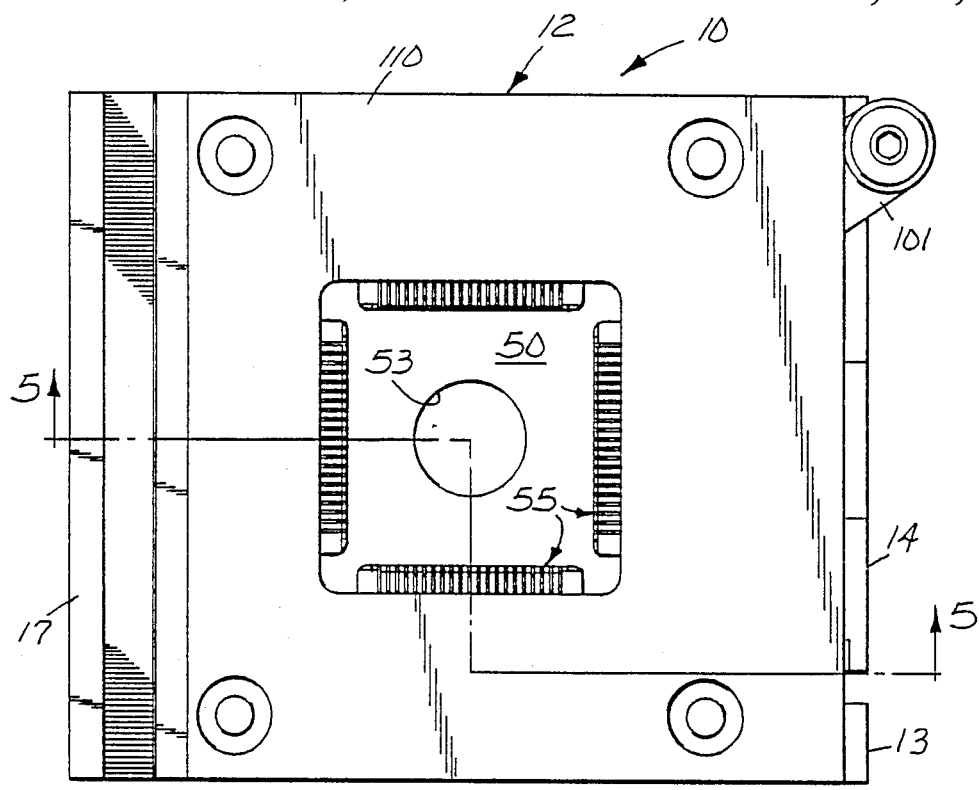
FIG. 1 is a top plan view of a socket according to the present invention.

The following detailed description of the invention will refer to the drawing wherein like reference numerals refer to like parts throughout the several views and parts have been removed for purposes of clarification in some of the views where to show the parts would make the drawing difficult.

Figure 2:
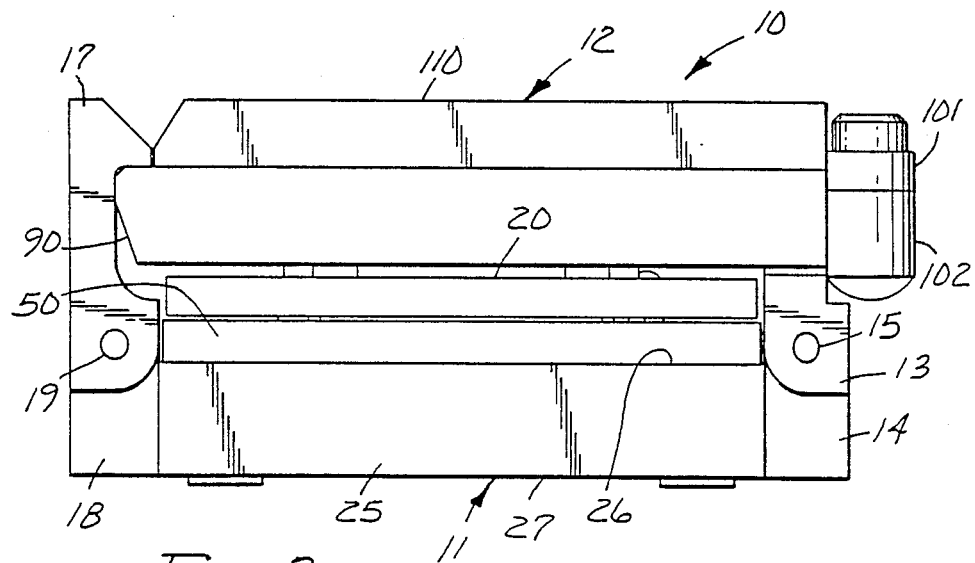
FIG. 2 is a front view of the socket with a carrier device inserted in the socket and the comb and contact members removed.
Figure 3:
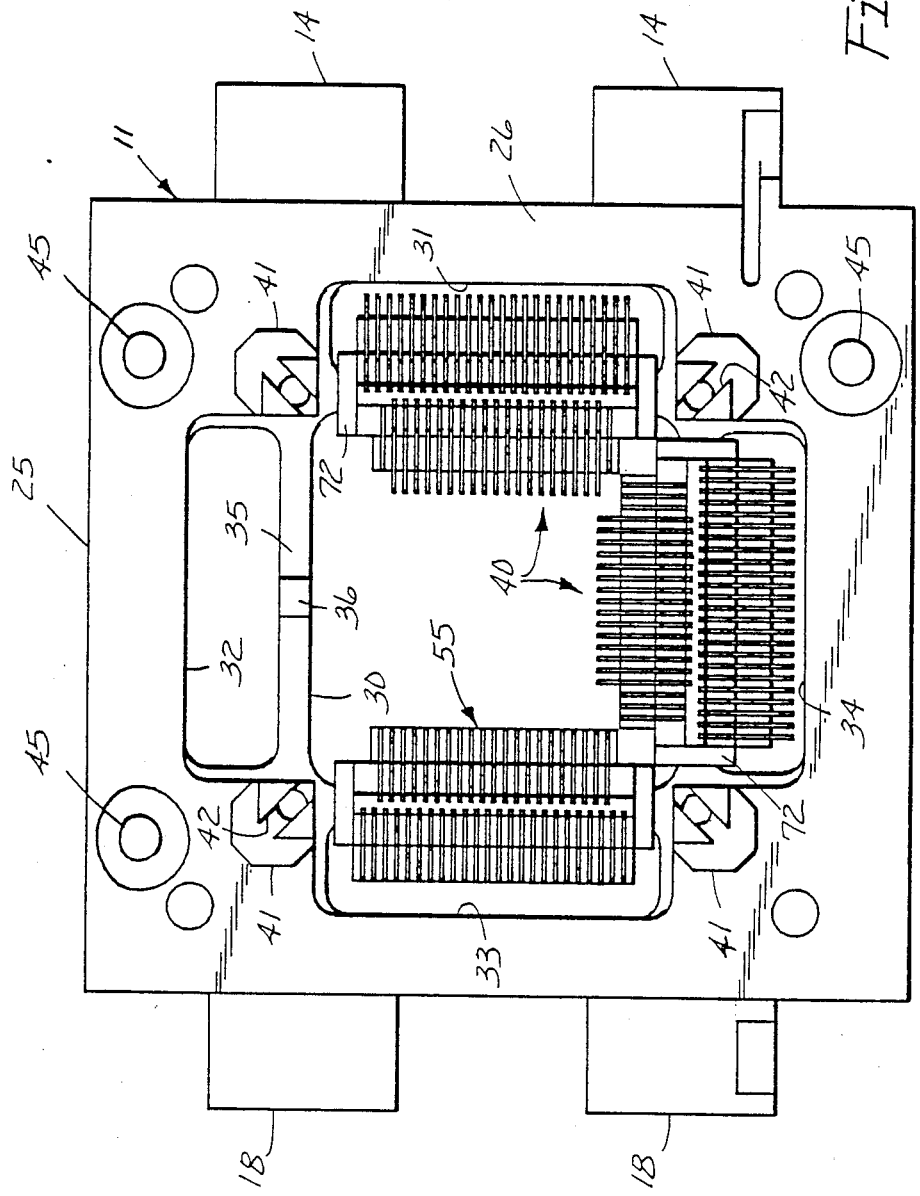
FIG. 3 is a top plan view of the frame of the base of the socket showing three of the possible four comb and contact members, with the base cover plate removed.
Figure 5:
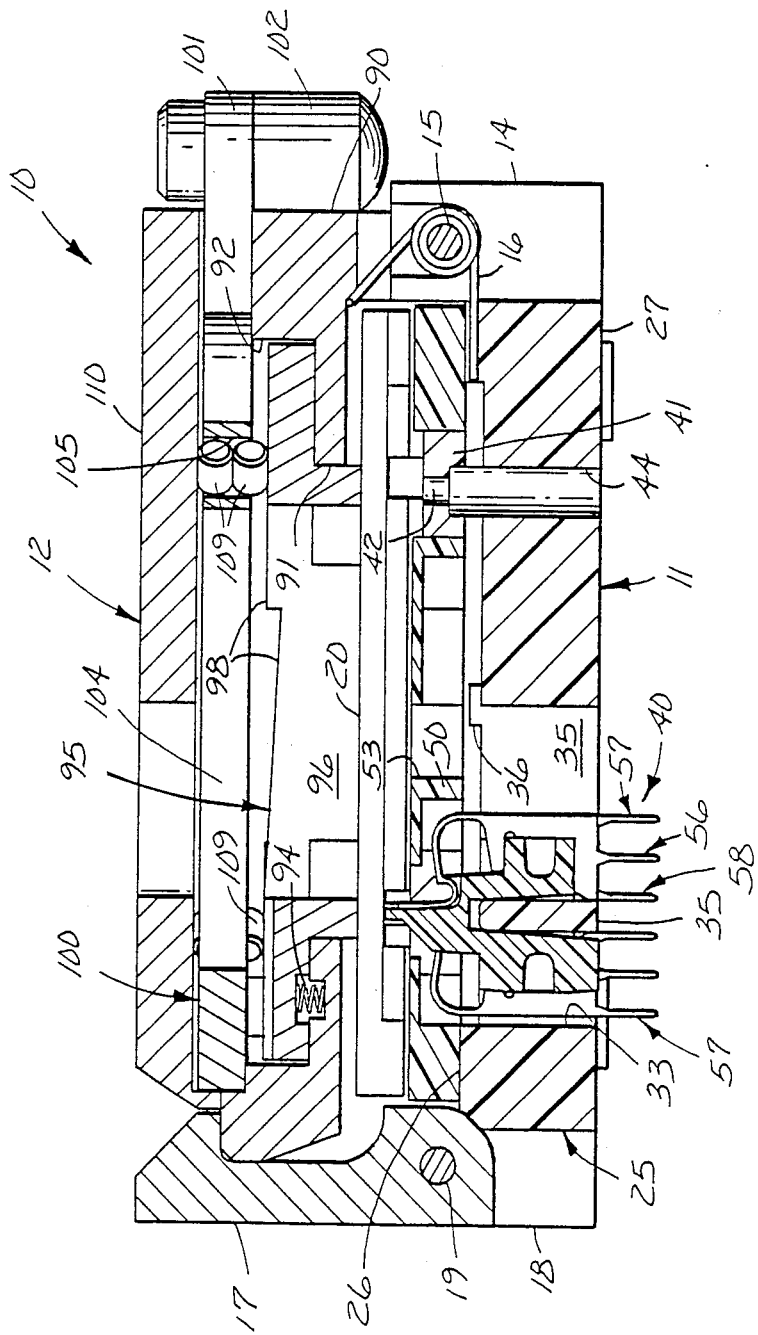
FIG. 5 is a sectional view taken approximately along the line 5—5 of FIG. 1.

The socket 10 of the present invention comprises a base 11 and a lid or cover 12. The lid 12 is hinged to the base 11 by means of cooperating ears 13 and 14 and a hinge pin 15. A spring 16 biases the lid 12 to a normal raised position. The lid is retained in a closed and latched position by a pivoted pawl 17. The pawl 17 is pivoted to ears 18 on the opposite side of the base by a pin 19 and a torsion spring (not shown) urges the pawl into latching position over a lip on the left edge of the lid 11 as shown in FIGS. 1, 2 and 5.

The base 11 comprises a machined or molded frame 25 of metal or insulative material, for example, glass reinforced polysulfone. The frame has ears 14 and 18 formed thereon, and has a top surface 26 and a bottom surface 27. The frame 25 has a central rectangular opening 30 surrounded by symmetrically spaced openings 31, 32, 33 and 34 defining narrow thick load supporting perpendicularly positioned beams 35 therebetween. Each of the beams 35 has a centrally disposed positioning means in the form of a projection 36. The upper surface of the beams 35 and the area at the ends of the openings 31, 32, 33 and 34 are slightly recessed to receive comb and contact members generally designated by the numeral 40. The frame 25 is further provided with standing alignment towers 41 positioned at the corners of the opening 30. Each tower 41 has a hexagonal base which is positioned in an opening in a base cover plate 50, a smaller generally square top portion having a slot 42 formed diagonally therein, and an opening 44 extending vertically through the tower. The slots 42 are formed to receive pins (not shown) in a carrier, designated by reference numeral 20, which slots are positioned to locate the carrier precisely with the frame 25 and alternatively some carriers have holes to receive locating pins so the openings 44 afford the installation of such locating pins. Pins 45 are positioned to locate a carrier in the proper orientation and are mounted in the base frame 25 to be received in recesses in the marginal edge of the carrier. The other openings in the frame 25 are for the reception of PC board mounting screws which are used to secure the base cover plate 50 onto the frame 25 over the comb and contact members 40.

Figure 4:
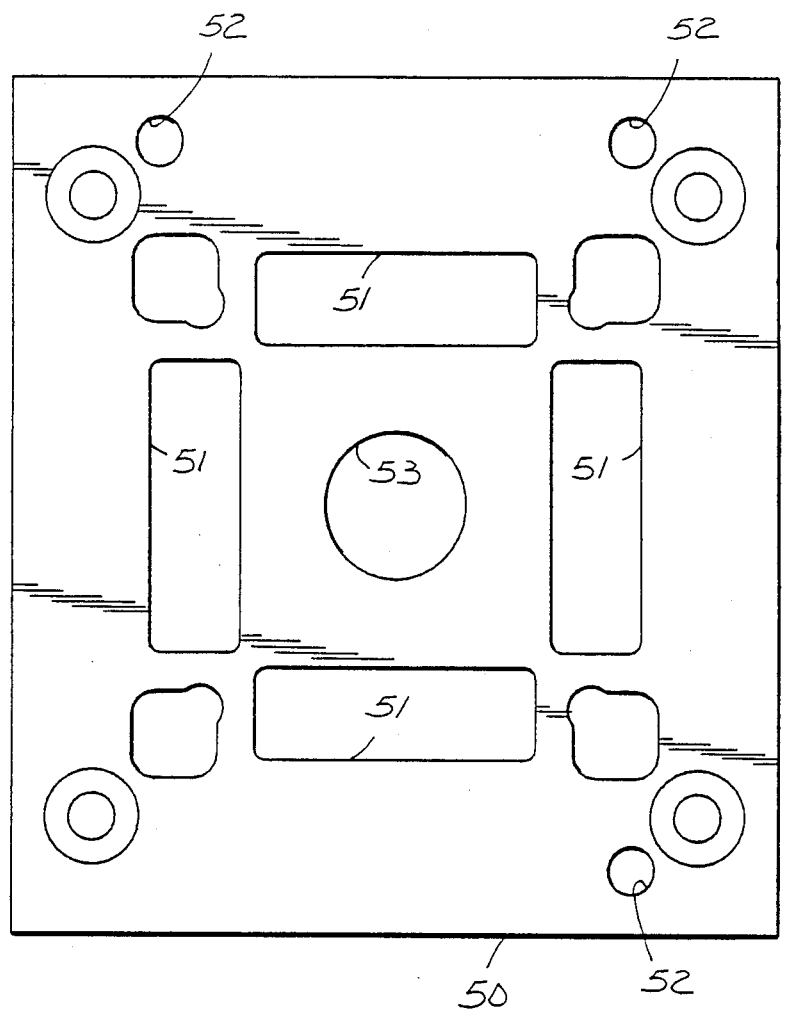
FIG. 4 is a top plan view of the base frame cover plate.

The cover plate 50 rests on the surface 26 and has openings 51 through which the tops of the comb and contact members 40 extend, but the plate 50 engages tabs on the ends of the comb and contact members 40 to resist them from being lifted off the beams 35. The plate 50 has three holes 52 to receive the alignment pins 45, a central opening 53, holes to receive the towers and assembly fasteners, see FIG. 4.

Figure 6:
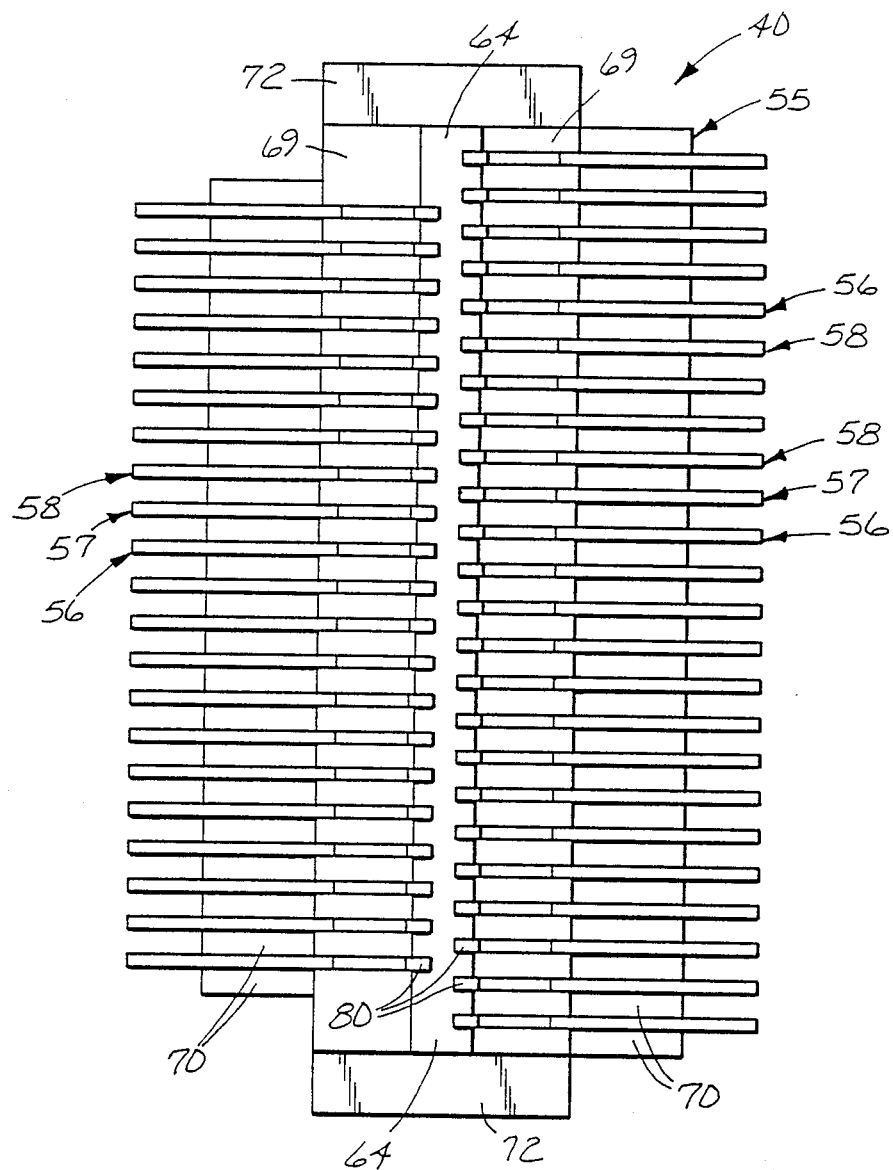
FIG. 6 is a plan view of a comb and contact member in enlarged scale.
Figure 7:
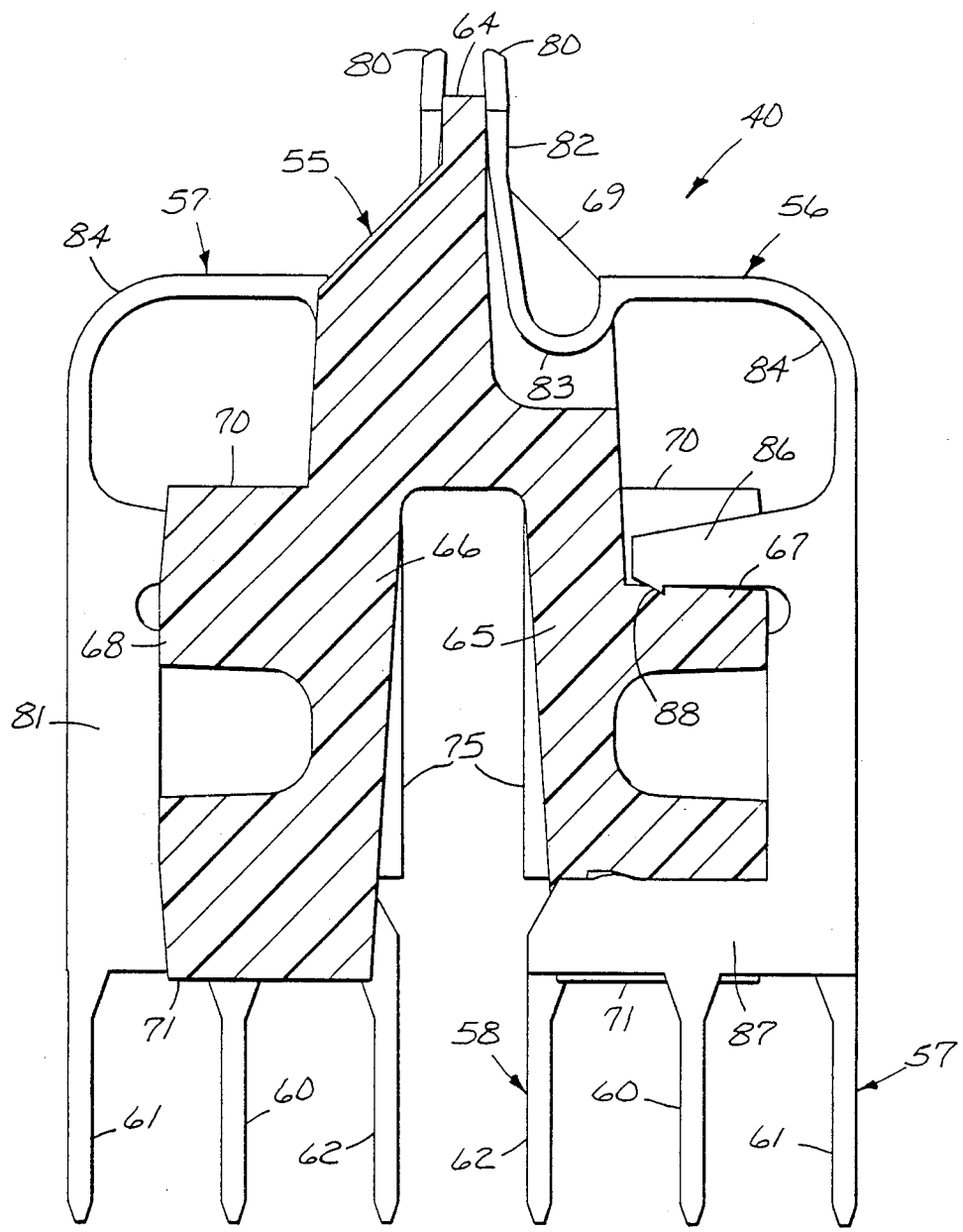
FIG. 7 is a transverse cross sectional view of the comb and contact member of FIG. 6.
Figure 8:
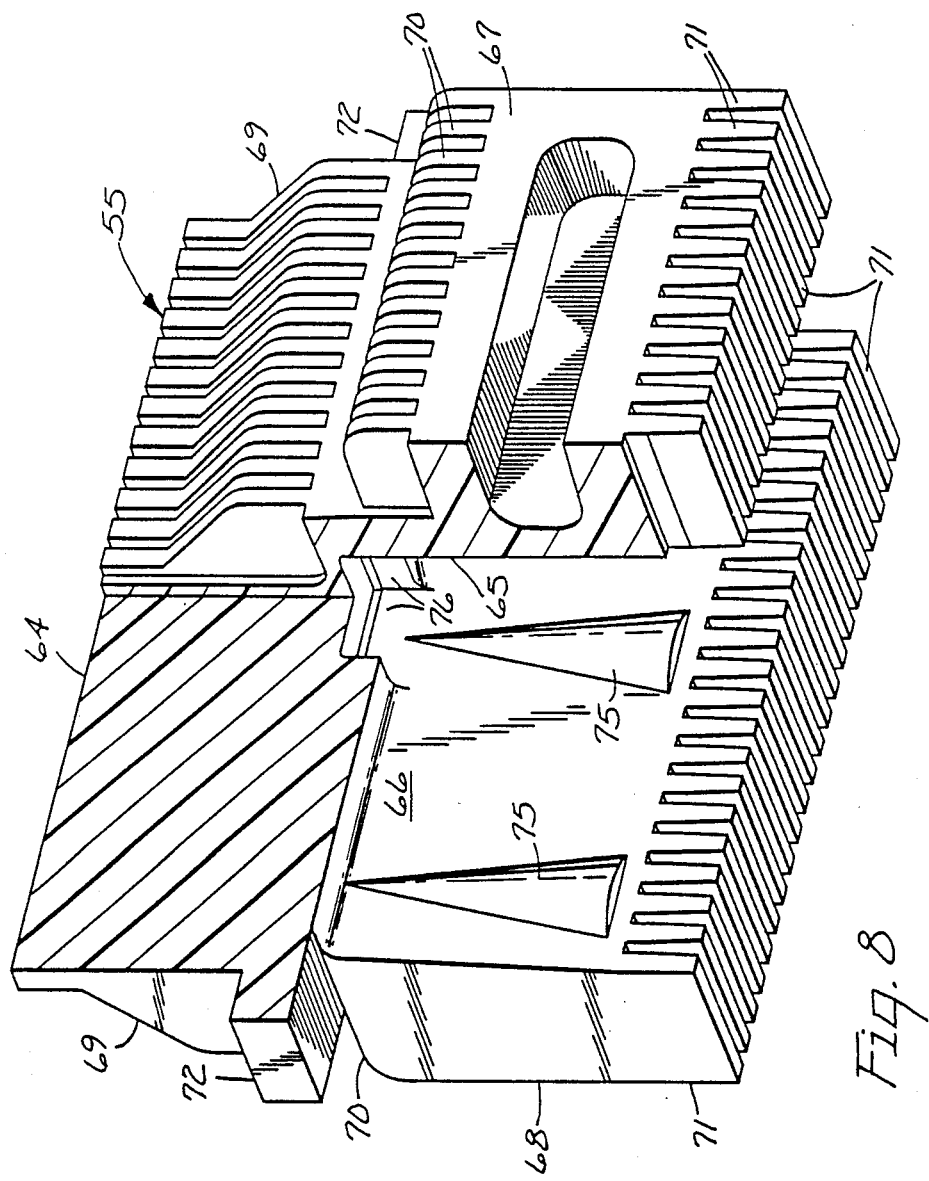
FIG. 8 is a perspective partial vertical sectional view of the comb of FIG. 6 and FIG. 7.

The comb and contact members 40 are illustrated most clearly in FIGS. 6, 7 and 8. The members 40 comprise a comb 55 and a plurality of contact members. The contacts illustrated have three different shaped and are identified as 56, 57 and 58, see FIG. 7. The contacts 56, 57 and 58 are of the same general configuration except the pins, 60, 61 and 62 respectively, are located at different positions.

The combs 55 are machined or molded, preferably of a strong polymeric electrically insulative material, and has a centrally disposed upper wall 64 having opposite ends and said wall member extends generally longitudinally of said comb between said ends. The wall 64 has a top, opposite sides and a base formed by spaced depending legs 65 and 66. The legs 65 and 66 have oppositely outwardly projecting feet forming shelves 67 and 68, the top and bottom surfaces of which form anchoring means for the contacts. The wall is supported on opposite sides from the base by thin spaced partitions or gussets 69, and the shelves 67 and 68 have similar aligned partitions 70 and 71, on their top and bottom surfaces respectively, between which are positioned the contacts 56, 57 and 58. Tabs 72 are positioned at each end of the wall 64 and extend there beyond to contact the base cover plate as described above. The legs 65 and 66 diverge from each other and are spaced to define a groove therebetween large enough to receive the beam 35. Spaced along the sides of the legs are cylindrical convex projections 75 which are parallel affording line contact with opposite sides of a beam 35 to accurately position the support comb on the beam. The base of the comb has a recess 76 formed centrally thereof to receive the projection 36 for locating the comb 55 on the beam longitudinally.

Each contact 56, 57 or 58 has a contact end 80 for making pressure contact with a contact pad on a TAB device or carrier, an intermediate body portion 81 affording movement of said contact end 80, and a pin 60, 61 or 62 defining a connecting end for making connection with a piece of electronic equipment. The contact end 80 has a straight portion 82 connected to a first arcuate flex area 83 of the intermediate portion 81 affording substantially straight line movement of the contact end 80 in relationship to the wall 64 of comb 55. The first flex area 83 is joined to a reversely curved arcuate second flex area 84 affording movement of the contact end 80 in relationship to the wall 64 of the comb 55. The geometry of the contact end 80 and the wall 64 is such that in the movement of the contact end from its normal unflexed position of FIG. 7 to the flexed position illustrated in FIG. 5, may be completely transitional or the optimum is for the contact end 80 to pivot about the top edge of the wall 64 to obtain about 0.002 inch (0.05 mm) of horizontal movement to afford adequate wiping action on the test pad of the TAB device or carrier to remove any oxide that may have built up on the pad. The intermediate portion 81 also has a contact anchoring portion affording means for anchoring the contact to the comb. The anchoring portion of the intermediate body portion 81 comprises a pair of spaced cantilever beams 86 and 87 one of which engages the top surface of the foot or shelf 67 or 68 and the other 87, engages the bottom of the shelf. The beams 86 are provided with a barb 88 which mechanically engages the top of the shelf to help affix the contact on the comb between two spaced partitions 69, 70 and 71. The pins 60, 61 and 62 afford means to connect the contacts to a piece of electronic equipment, such as a PC board, a socket or other contacts.

The lid 12 is provided with means to drive forcefully the pads of the TAB device or carrier vertically or in a straightline direction toward the contact ends 80 of the contacts to make good electrical contact with the contacts. The lid 12 has a rectangular frame 90 with a central rectangular opening 91 and a circular recess 92 in the upper surface surrounding the opening 91. Spaced bores in the frame recess 92 receive springs 94. The frame 90 supports the ears 13 and defines a lip to receive the pawl 17. Positioned in the recess 92 and extending through the rectangular opening 91 is a circular plate 95 having depending ribs 96 which terminate in flat surfaces in a plane to contact the surface of the TAB device or carrier opposite the pads. The opposite side of the plate 95 is formed with a plurality of arcuate inclined ramps or cam surfaces 98. Positioned above the ramped surface of the plate 95 is an actuator member 100 in the form of a flat disc having a lever 101 extending radially outward from one edge and having a knob 102 fixed thereto. The disc 100 has a central opening 104 and spaced slots 105 positioned above the ramped surfaces 98. The slots 105 each receive a pair of cylindrical rollers 109 which engage the ramps 98 and afford vertical movement of the plate 95 upon rotation of the actuator disc 100. A top plate 110 is fastened above the frame 90 to resist the upward movement of the actuator 100, thus transferring the rotational movement of the actuator 100 into vertical movement of the plate 95 through the ramps and against the bias of springs 94. Top plate 110 is secured by PC board fastening screws to the base 90 to securely hold the two together.

The vertical movement of the plate 95 drives the TAB device or carrier against the contact ends of the contacts supported in the combs on the beams 35. The central mounting of the combs limits the expansion of the comb to the longitudinal direction from the center projection 36 of the beams and any movement of the beams is longitudinal with respect to the same center point. Movement of the contact end of the contacts is vertical as illustrated or transitional and restricts any buckling or other distortion of the TAB device by the contacts. The contacts are illustrated in two staggered rows but the partitions could be positioned opposite each other in relationship to the wall 64 and thus change the positions of the contact ends. The contacts can also be disposed in a single row and on one side of the comb. The width of the beams 35 is such that the forces developed in the contacts being flexed is absorbed and there is no distortion of the combs to reduce the contact pressure of the contacts against the test pads of the carrier at the center or ends of a row of pads.

Having described the present invention with relationship to the accompanying drawing illustrating the preferred embodiment of the same, it is to be understood that changes in the configuration of parts or their relationship may be made without departing from the spirit or scope of the present invention as defined by the appended claims.

We claim:

1. In a socket for test and burn-in of an integrated circuit device, mounted for example on a tape having a plurality of pads connected to paths to the leads of the device, a comb and contact member comprising;
   a support for a plurality of contacts, said support having a first surface which will be disposed in a plane generally parallel to a said tape and a wall having a face generally perpendicular to said plane and means for retaining said contacts in spaced relationship along said wall,
   each contact having a contact end for making pressure contact with a pad on a said tape, an intermediate body portion affording movement of said contact end, and a connecting end for making connection with a piece of electronic equipment, said contact end having a straight portion contacting said face of said wall and connected to a first flex of said intermediate portion affording movement of said contact end and straight portion generally perpendicular to said plane, and said first flex area being joined to a curved arcuate second flex area affording movement of said contact end toward the wall of said support when said contact end engages a said tape, and said intermediate portion having a further contact anchoring portion to hold the contact to said support and join the contact end to said connecting end.

2. In a socket for test and burn-in of an integrated circuit device, mounted for example on a tape having a plurality of pads connected by paths to the leads of the device, a comb and contact member comprising;
   a support for a plurality of contacts, said support having opposite ends and a wall which extends generally longitudinally of said support between said ends, said wall having a top, opposite sides and a base, said wall including said means for spacing said contacts and including partitions extending from said opposite sides and shelves extending from said sides adjacent said base,
   each contact having a contact end for making pressure contact with a pad on a said tape, an intermediate body portion affording movement of said contact end, and a connecting end for making connection with a piece of electronic equipment, said contact end having a straight portion connected to a first flex area of said intermediate portion affording generally straight line movement of said contact end in relationship to the intermediate body portion, and said first flex area being joined to a curved arcuate second flex area affording movement of said contact end in relationship to a wall of said support, and said intermediate portion having a further contact anchoring portion to hold the contact to said shelves of said support and join the contact end to said connecting end, and said contact ends of said contacts being positioned in contact with said sides of said wall and terminating beyond said top.

3. A comb and contact member according to claim 2 wherein said support has spaced sides joined to said shelves to define a rib receiving groove therebetween and below said wall for mounting said support on a frame, and said spaced sides diverge from said base of said wall and each side has opposed projections terminating in parallel spaced cylindrical surfaces for making sliding contact with the frame.

4. A comb and contact member according to claim 2 wherein said partitions on opposite sides of said wall are offset from one another to position said contact ends in staggered rows.

5. A socket for test and burn-in of an integrated circuit device mounted on a tape with a plurality of pads connected by paths to the leads of the device, said socket comprising;
   a frame having a plurality of beams defining an opening,
   a plurality of contact support combs, each support comb being disposed one on each beam, said support combs each supporting a plurality of contacts, said support combs having means for retaining said contacts in spaced relationship,
   each contact having a contact end for making pressure contact with a pad on a said tape, an intermediate body portion affording movement of said contact end, and a connecting end for making connection with a piece of electronic equipment,
   said contact end having a straight portion connected to a first flex area of said intermediate portion affording straight line movement of said contact end in relationship to the intermediate body portion, and said first flex area being joined to a curved arcuate second flex area affording movement of said contact end in relationship to said support, and said intermediate portion having a further contact anchoring portion to hold the contact to said support and join the contact end to said connecting end.

6. A socket according to claim 5 wherein each beam is provided with means generally centrally thereof for aligning said support comb on said beam.

7. A socket according to claim 5 wherein each said support comb has opposite ends and central wall extends generally longitudinally of said support comb between said ends, said wall having a top, opposite sides and a base, said wall including said means for spacing said contacts and including partitions extending from said opposite sides and shelves extending from said sides adjacent said base, said shelves accommodating said anchoring means of each of said contacts, and said support comb having spaced sides joined to said shelves to define a beam receiving groove therebetween and below said wall for mounting each said support comb on a beam and including means for aligning said support comb on said beam, and said contact ends of said contacts being positioned in contact with said sides of said wall and terminating beyond said top.

8. A socket according to claim 5 wherein said frame includes alignment means for centering and aligning a said tape, integrated circuit device and tape pads with said contact ends.

9. A socket according to claim 8 further comprising a cover member pivoted to said frame for movement toward and away from said frame and including means for driving a said tape and pads into engagement with said contact ends with sufficient force to cause straight line movement of said contact ends.

10. A socket according to claim 9 wherein said means for driving a said tape and pads comprises
a base having an opening to expose said contacts,
a plate positioned an said base having opposite sides and having ribs positioned on one side and extending through said opening in said base and being aligned with said contacts, and having cam surfaces on the opposite side, and
actuator means engaged with said cam surfaces of said plate to afford movement of said ribs toward and away from said contacts.

11. A comb and contact assembly for use in a socket to support a leadless integrated circuit device, said assembly comprising:
a plurality of contacts, each contact having a contact end for making pressure contact with a pad on a said device, an intermediate body portion affording movement of said contact end, and a connecting end for making connection with a piece of electronic equipment,
said contact end having a straight portion connected to a first flex area of said intermediate portion affording straight line movement of said contact end in relationship to the intermediate body portion, and said first flex area being joined to a curved arcuate second flex area affording movement of said contact end in relationship to said support, and said intermediate portion having a further contact anchoring portion to hold the contact to said support and join the contact end to said connecting end, and
a support having a first wall member for engaging said straight portion of said contact end to restrict movement of said contact end laterally of a path of straight line movement, spaced partitions to restrict transverse movement of the contact end, and another means for contact with said intermediate portion for securing each contact to said support, and means for mounting the support on a frame.

12. A comb and contact assembly according to claim 11 wherein said wall member is positioned on a base having spaced depending legs affording said means for mounting the supporting on a frame.

13. A comb and contact assembly according to claim 12 wherein said depending legs are spaced and define a groove therebetween for frictionally receiving therebetween a support beam of a said socket, and said legs have partitions aligned with said spaced partitions for supporting said intermediate portions of said contacts.

14. A comb and contact assembly according to claim 11 wherein said plurality of contacts are positioned on opposite sides of said wall member.

15. A comb and contact assembly according to claim 14 wherein said contacts are staggered on opposite sides of said wall member to form on said support two spaced rows of contact ends with the ends in one row offset from the ends of the other row.

16. A comb and contact assembly for use in a socket to support a leadless integrated circuit device, said assembly comprising:
a support having a wall member extending longitudinally of said support, said wall having a top, opposite sides and a base, spaced partitions on said opposite sides,
a plurality of contacts disposed along said opposite sides of said wall member with each contact positioned between said spaced partitions, each contact having a contact end for making pressure contact with a pad on a said device, an intermediate body portion affording movement of said contact end, and a connecting end for making connection with a piece of electronic equipment,
said contact end having a straight portion connected to a first flex area of said intermediate portion affording straight line movement of said contact end along a side of said wall member, and said first flex area being joined to a curved arcuate second flex area affording movement of said contact end in relationship to said support, and said intermediate portion having a further contact anchoring portion to hold the contact to said support and join the contact end to said connecting end.

* * * * *